(12) United States Patent
Kong et al.

(10) Patent No.: US 12,300,607 B2
(45) Date of Patent: May 13, 2025

(54) THREE-DIMENSIONAL MEMORY DEVICE

(71) Applicant: Fujian Jinhua Integrated Circuit Co., Ltd., Quanzhou (CN)

(72) Inventors: Guoguo Kong, Quanzhou (CN); Shi-Wei He, Quanzhou (CN); Yun-Fan Chou, Quanzhou (CN); Dongxiang Zhu, Quanzhou (CN); Gang Wu, Quanzhou (CN); Canfa Dai, Quanzhou (CN); Jianxiong Lai, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 464 days.

(21) Appl. No.: 17/705,375

(22) Filed: Mar. 27, 2022

(65) Prior Publication Data

US 2023/0187351 A1 Jun. 15, 2023

(30) Foreign Application Priority Data

Dec. 10, 2021 (CN) .......................... 202111507546.2
Dec. 10, 2021 (CN) .......................... 202123107759.4

(51) Int. Cl.
*H01L 23/52* (2006.01)
*H01L 23/528* (2006.01)
*H01L 23/535* (2006.01)
*H10B 41/27* (2023.01)
*H10B 43/27* (2023.01)

(52) U.S. Cl.
CPC ........ *H01L 23/5283* (2013.01); *H01L 23/535* (2013.01); *H10B 41/27* (2023.02); *H10B 43/27* (2023.02)

(58) Field of Classification Search
CPC ........ H10B 43/40; H10B 41/50; H10B 41/20; H10B 43/20; H10B 41/27; H10B 43/27; H10B 43/50; H01L 21/76895; H01L 23/5226; H01L 21/76831; H01L 21/76834; H01L 23/5283; H01L 23/535
See application file for complete search history.

(56) References Cited

U.S. PATENT DOCUMENTS

| 10,615,124 B2* | 4/2020 | Park ..................... H01L 29/0649 |
| 10,680,003 B2* | 6/2020 | Lu ...................... H01L 23/53209 |
| 2011/0031547 A1* | 2/2011 | Watanabe ......... H01L 29/66833 257/E21.409 |
| 2013/0056818 A1* | 3/2013 | Iino ........................ H10B 43/35 257/E21.09 |
| 2018/0366481 A1* | 12/2018 | Kothari ............. H01L 21/31144 |

* cited by examiner

*Primary Examiner* — Shouxiang Hu
(74) *Attorney, Agent, or Firm* — Winston Hsu

(57) ABSTRACT

A three-dimensional memory device includes a staircase structure comprising steps respectively comprising a conductive layers and a dielectric layer. A sidewall of the conductive layer is recessed from a sidewall of the dielectric layer to form a recess that exposes a portion of a bottom surface of the dielectric layer.

9 Claims, 10 Drawing Sheets

THREE-DIMENSIONAL MEMORY DEVICE

BACKGROUND OF THE INVENTION

1. Field of the Invention

The present invention is related to a semiconductor device. More particularly, the present invention is related to a three-dimensional memory device and a manufacturing method for forming the same.

2. Description of the Prior Art

Memory devices are indispensable and important parts in modern electronic products. In addition to memorize the user's data, the memory devices are also responsible for memorizing the program code executed by the central processing unit and the information that needs to be temporarily saved during the operation. Semiconductor memory devices may be classified into volatile memory devices and non-volatile memory devices. Data stored in a volatile memory device such as a dynamic random access memory (DRAM) or a static random access memory (SRAM) is erased when the volatile memory device is out of power supply, and must be re-entered at the next power supply. Data stored in a non-volatile memory device such as a read-only memory (ROM) or a flash memory is still kept in the non-volatile memory device when the power is turned off, so that the data may be directly read after the power is supplied again.

NAND flash memory is the most widely used non-volatile memory with the advantages of small size, low power consumption, fast operation speed and low manufacturing cost. As the semiconductor manufacturing technology continues to progress, a three-dimensional (3D) NAND flash memory has been developed to obtain a higher cell density to meet the demand for a higher storage capacity. How to manufacture the three-dimensional structure and improve the process window to maintain a stable yield are important research topic in this field.

SUMMARY OF THE INVENTION

In light of the above, the present invention is directed to provide a three-dimensional (3D) memory device and a manufacturing method for forming the same. The staircase structure of the 3D memory device provided by the present invention is formed by performing a trim-etching process to etch alternately stacked dielectric layers and conductive layers of a memory stack structure. In this way, the steps of the staircase structure may respectively have a step nosing portion (a portion of the dielectric layer that protrudes from a sidewall of the conductive layer). The step nosing portion may provide additional etch stop function to reduce the risk of the misaligned word line contact plug directly contacting the conductive layer of another step, so that device failure due to short circuit may be reduced.

According to an embodiment of the present invention, a three-dimensional memory device is provided. The three-dimensional memory device includes a substrate having a first region and a second region, and a memory stack structure comprising a plurality of conductive layers and dielectric layers alternately stacked on the substrate and extending from the first region to the second region. The memory stack structure on the second region comprises a staircase structure comprising steps respectively comprising one of the conductive layers and one of the dielectric layers, wherein for each of the steps a sidewall of the conductive layer is recessed from a sidewall of the dielectric layer to form a recess that exposes a portion of a bottom surface of the dielectric layer.

According to another embodiment of the present invention, a method for forming a three-dimensional memory device is provided and includes the steps of providing a substrate comprising a first region and a second region, forming a memory stack structure comprising a plurality of conductive layers and dielectric layers alternately stacked on the substrate and extending from the first region to the second region, and performing a trim-etching process to form a staircase structure on the memory stack structure on the second region of the substrate, wherein the staircase structure comprises a plurality of steps respectively comprising one of the conductive layers and one of the dielectric layers, wherein for each of the steps a sidewall of the conductive layer is recessed from a sidewall of the dielectric layer to form a recess that exposes a portion of a bottom surface of the dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present invention. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

DETAILED DESCRIPTION

Figure 1:
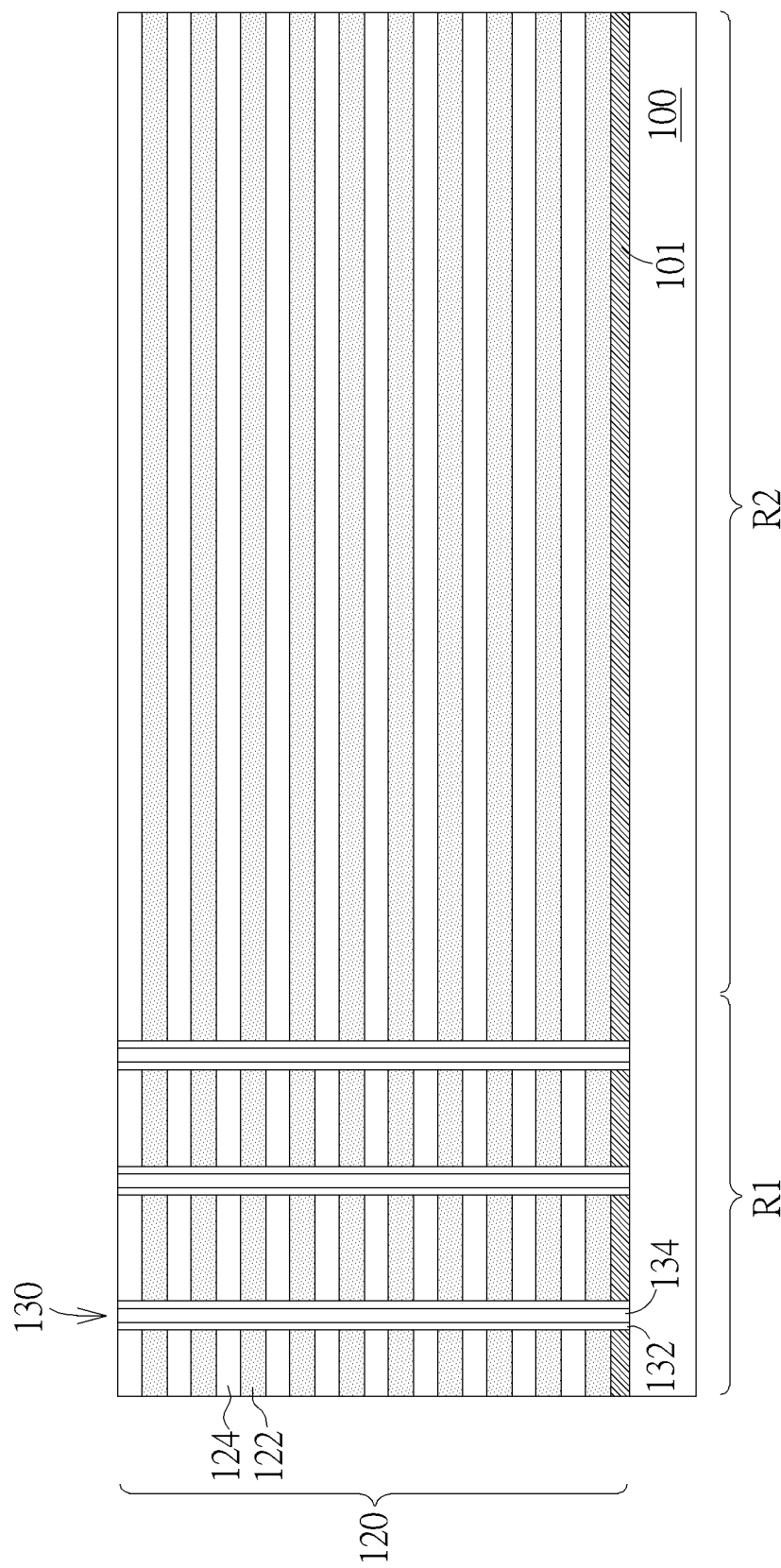
FIG. 1 to FIG. 10 are schematic diagrams illustrating the manufacturing steps of a method for forming a three-dimensional (3D) memory device according to an embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The terms "about", "approximately" or "substantially" are used in the specification to note that a variation with 10%, 5%, 3%, 2%, 1%, or 0.5% of a given value or range is allowed. The quantities or values exemplified in the embodiments are approximate quantities or values even the terms "about", "approximately" or "substantially" are not specifically specified in the description.

Spatially relative terms, such as "beneath", "below", "under", "lower", "above", "upper", "on", "over" and the like may be used herein to describe one element or feature's spatial relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 10 are schematic diagrams illustrating the manufacturing steps of a method for forming a three-dimensional (3D) memory device according to an embodiment of the present invention. Please refer to FIG. 1. A substrate 100 is provided. Following, a memory stack structure 120 is formed on the substrate 100, and a plurality of channel structures 130 are formed in the memory stack structure 120. According to an embodiment of the present invention, a pad layer 101 may be disposed between the substrate 100 and the memory stack structure 120. The pad layer 101 may include silicon oxide, but is not limited thereto. The channel structures 130 extend through the memory stack structure 120 and the pad layer 101 and directly contact the substrate 100.

The substrate 100 may be a silicon substrate, a silicon-containing substrate, an epitaxial silicon substrate, a silicon-on-insulator substrate, or a substrate made of other suitable materials. The substrate 100 may include a first region R1 and a second region R2 that is adjacent to the first region R1. The first region R1 may be a memory array region, and the second region R2 may be a word line contact region.

The memory stack structure 120 includes a plurality of conductive layers 122 and dielectric layers 124 that are arranged alternately on the substrate 100. The memory stack structure 120 extends from the first region R1 to the second region R2. The conductive layer 122 may include a conductive material such as aluminum (Al), titanium (Ti), tantalum (Ta), tungsten (W), niobium (Nb), molybdenum (Mo), copper (Cu), titanium nitride (TiN), titanium carbide (TiC), tantalum nitride (TaN), titanium tungsten (Ti/W), titanium and titanium nitride (Ti/TiN), polysilicon, doped silicon, silicide, other metal or non-metal conductive materials, or any combination thereof, but is not limited thereto. According to an embodiment of the present invention, the conductive layers 122 may include tungsten (W). The dielectric layer 124 may include a dielectric material such as silicon oxide ($SiO_x$), silicon nitride (SiN), silicon oxynitride (SiON), or a combination thereof, but is not limited thereto. According to an embodiment of the invention, the dielectric layer 124 may include silicon oxide.

The channel structure 130 may have a columnar shape (such as a cylindrical shape) and extend vertically (along a direction perpendicular to the surface of the substrate 100) through the memory stack structure 120 and the pad layer 101 on the second region R2. The channel structure 130 mainly includes a functional layer 132 disposed along the sidewall of the channel hole (not shown) and a filling layer 134 filling the remaining space of the channel hole. According to an embodiment of the present invention, the functional layer 132 may include a multi-layer structure (not shown) that includes a channel layer and an ONO composite layer disposed between the channel layer and the sidewall of the channel hole (not shown). The channel layer may include a semiconductor material, such as polysilicon. The ONO composite layer may include two silicon oxide layers and a silicon nitride layer sandwiched between the two silicon oxide layers. The filling layer 134 may include a dielectric material, such as silicon oxide. The overlapping regions of the channel structure 130 and the conductive layers 122 are the positions of the memory cells. The conductive layers 122 are word lines that are used to control the data writing and data reading of the memory cells.

Please refer to FIG. 2 to FIG. 8, which illustrate a trim-etching process performed to form a staircase structure 160 on the memory stack structure 120 on the second region R2 of the substrate 100. The trim-etch process may be performed using a single mask layer or multiple mask layers according to the total number of layers of the memory stack structure 120. In the embodiment shown in FIG. 2 to FIG. 8, the trim-etching process using two mask layers (the patterned mask layer 140 and the patterned mask layer 150) is only an example. It should be understood that other numbers of mask layers may be used to form the staircase structure 160 and should also be included in the scope of the present invention.

Figure 2:
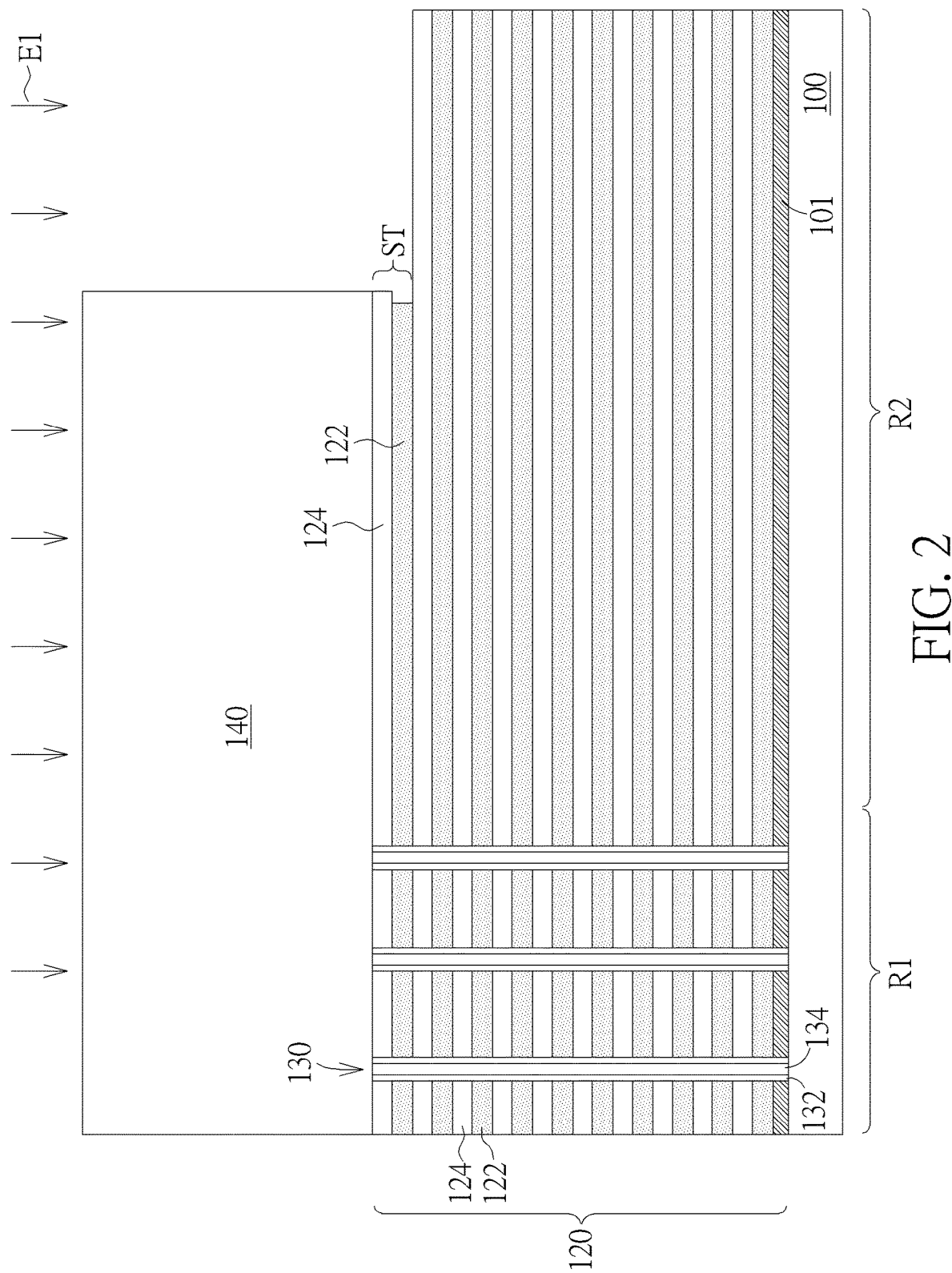
Figure 3:
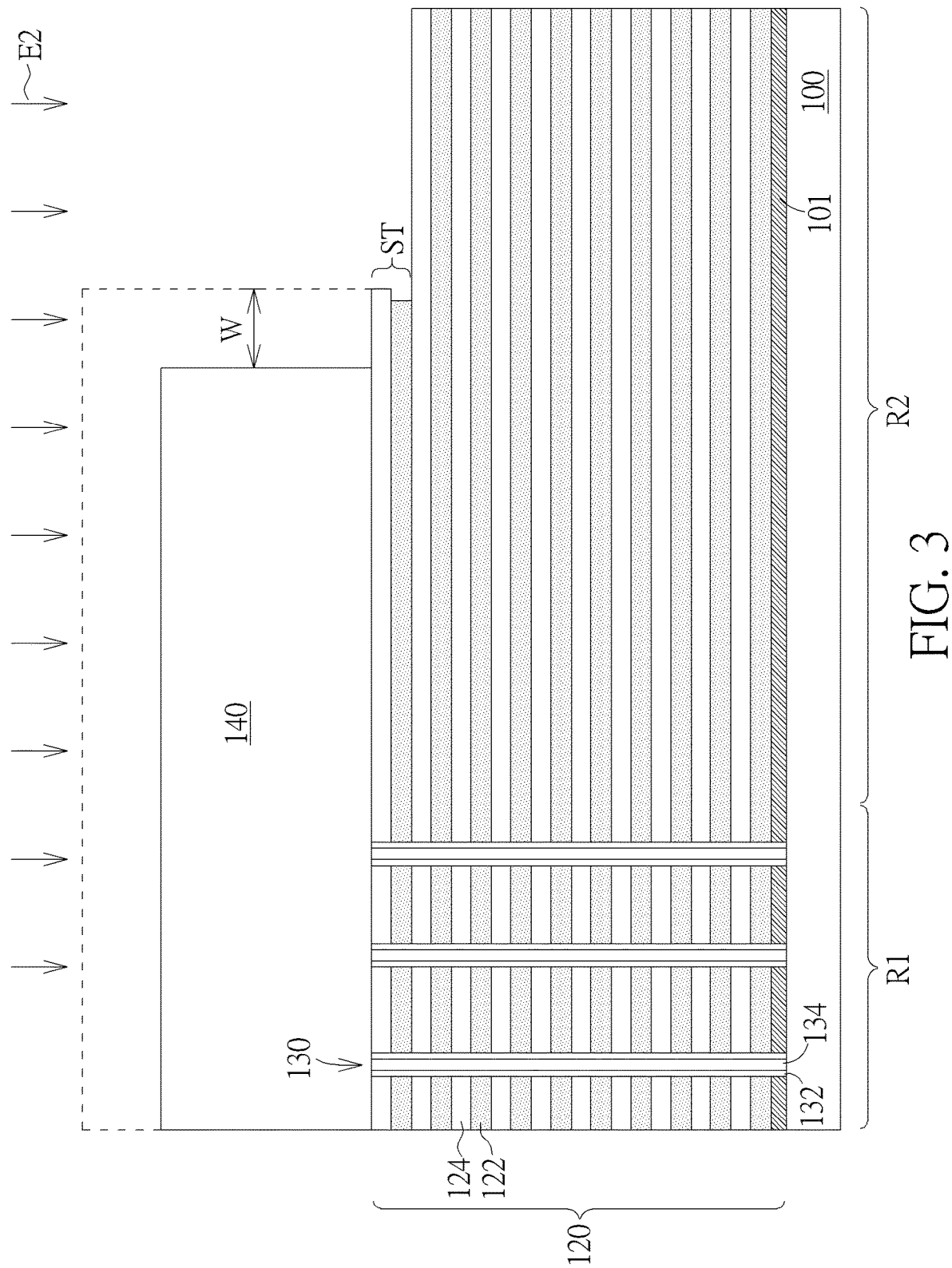

As shown in FIG. 2, the trim-etching process includes forming a patterned mask layer 140 (such as a photoresist layer) on the memory stack structure 120. An etching step E1 (such as a dry etching process and/or a wet etching process) is performed, using the patterned mask layer 140 as an etching mask to etch and remove the exposed portion of the memory stack structure 120 (the first exposed pair of the dielectric layer 124 and the conductive layer 122), thereby forming a step ST on the upper half portion of the memory stack structure 120. The step ST includes a conductive layer 122 and a dielectric layer 124 directly on the conductive layer 122. Subsequently, as shown in FIG. 3, a trim step E2 (such as a wet etching process) is performed to remove a portion of the patterned mask layer 140 until a portion of the top surface of the dielectric layer 124 of the step ST just formed is exposed from the patterned mask layer 140 and has a pre-determined width W. Following, as shown in FIG. 4, the etching step E1 is performed, using the trimmed patterned mask layer 140 as an etching mask to etch and remove the exposed portion of the memory stack structure 120 (the first exposed pair of the dielectric layer 124 and the conductive layer 122), thereby forming another step ST on the upper half portion of the memory stack structure 120.

Figure 4:
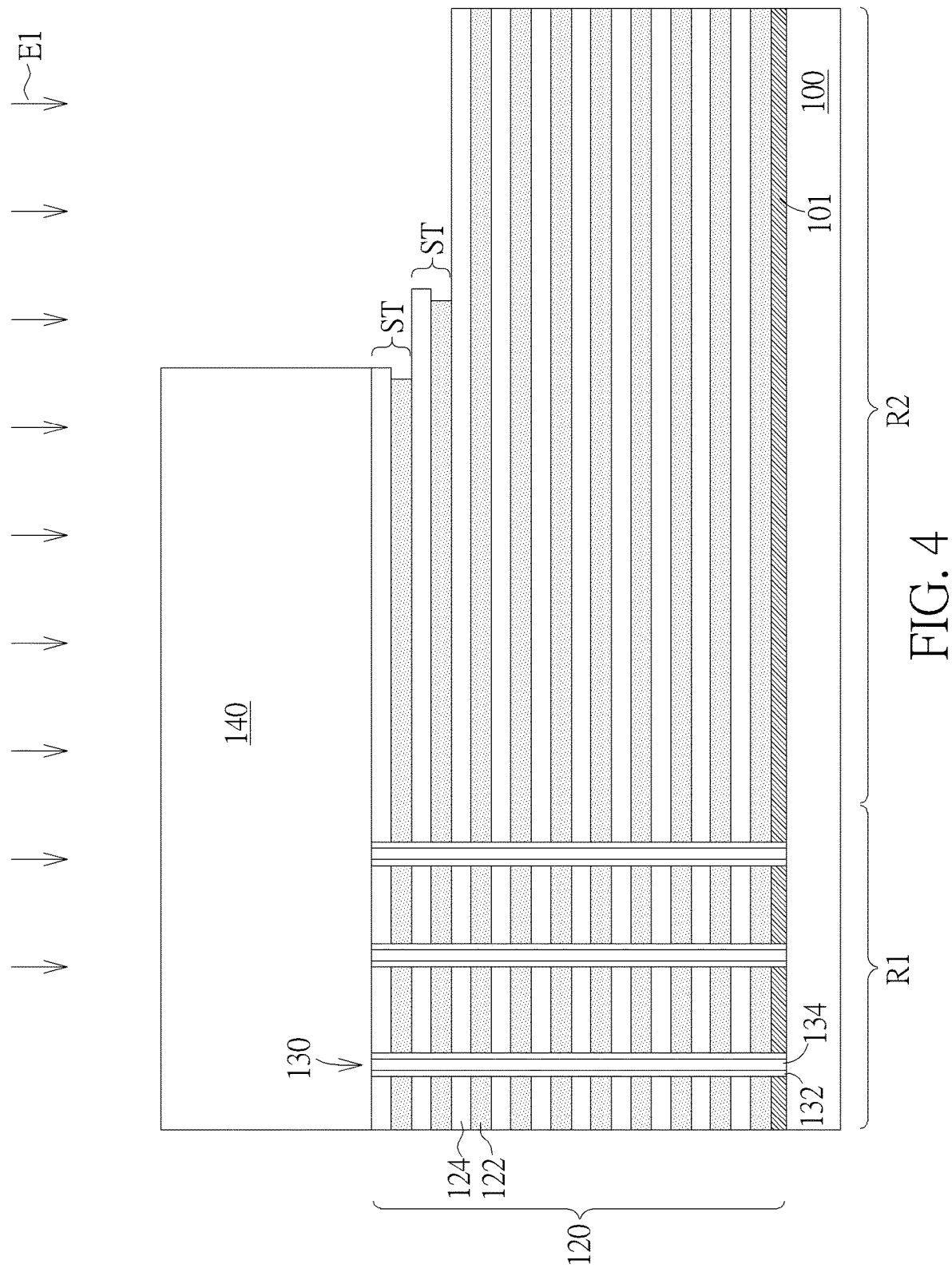
Figure 5:
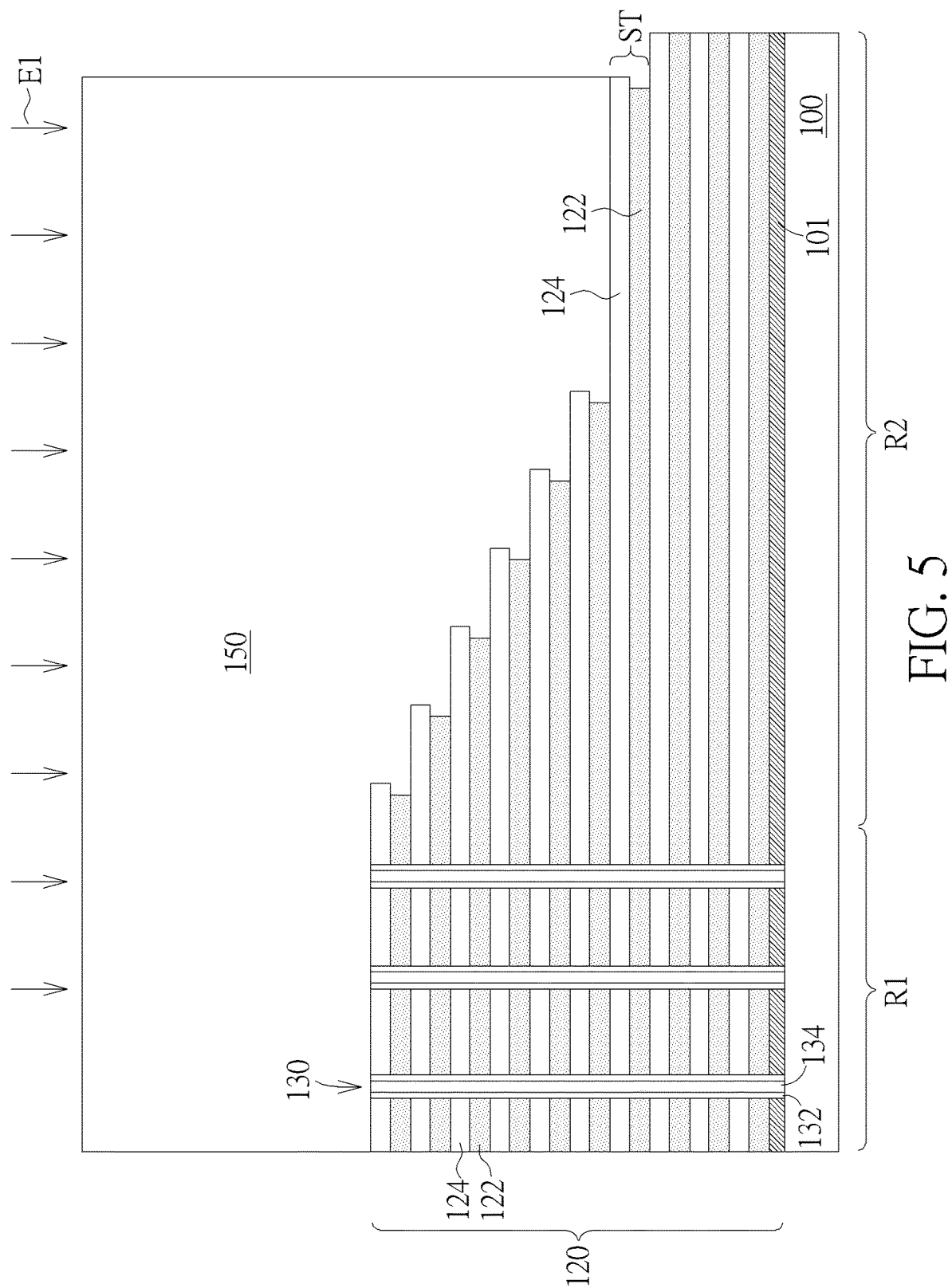
Figure 6:
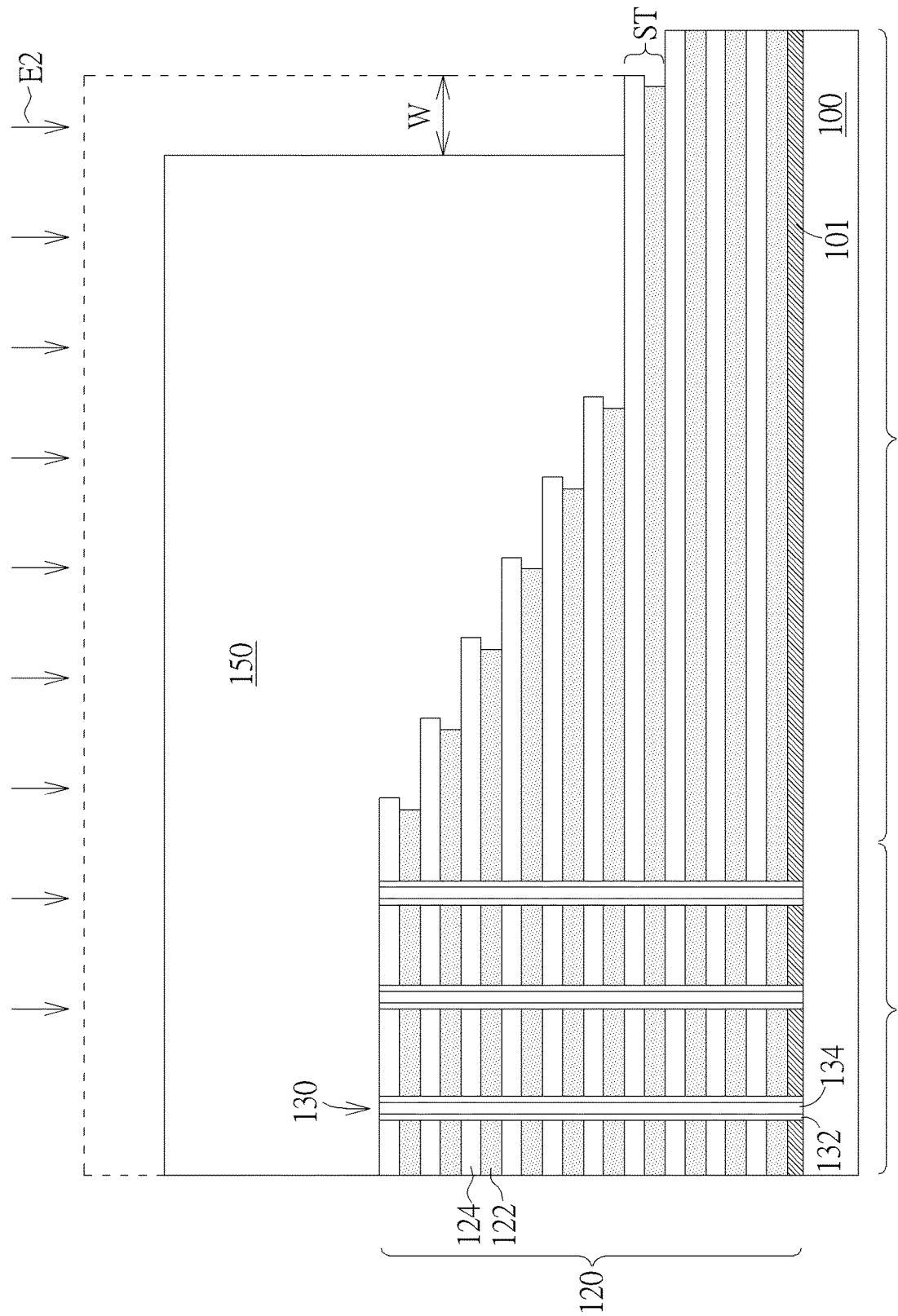
Figure 7:
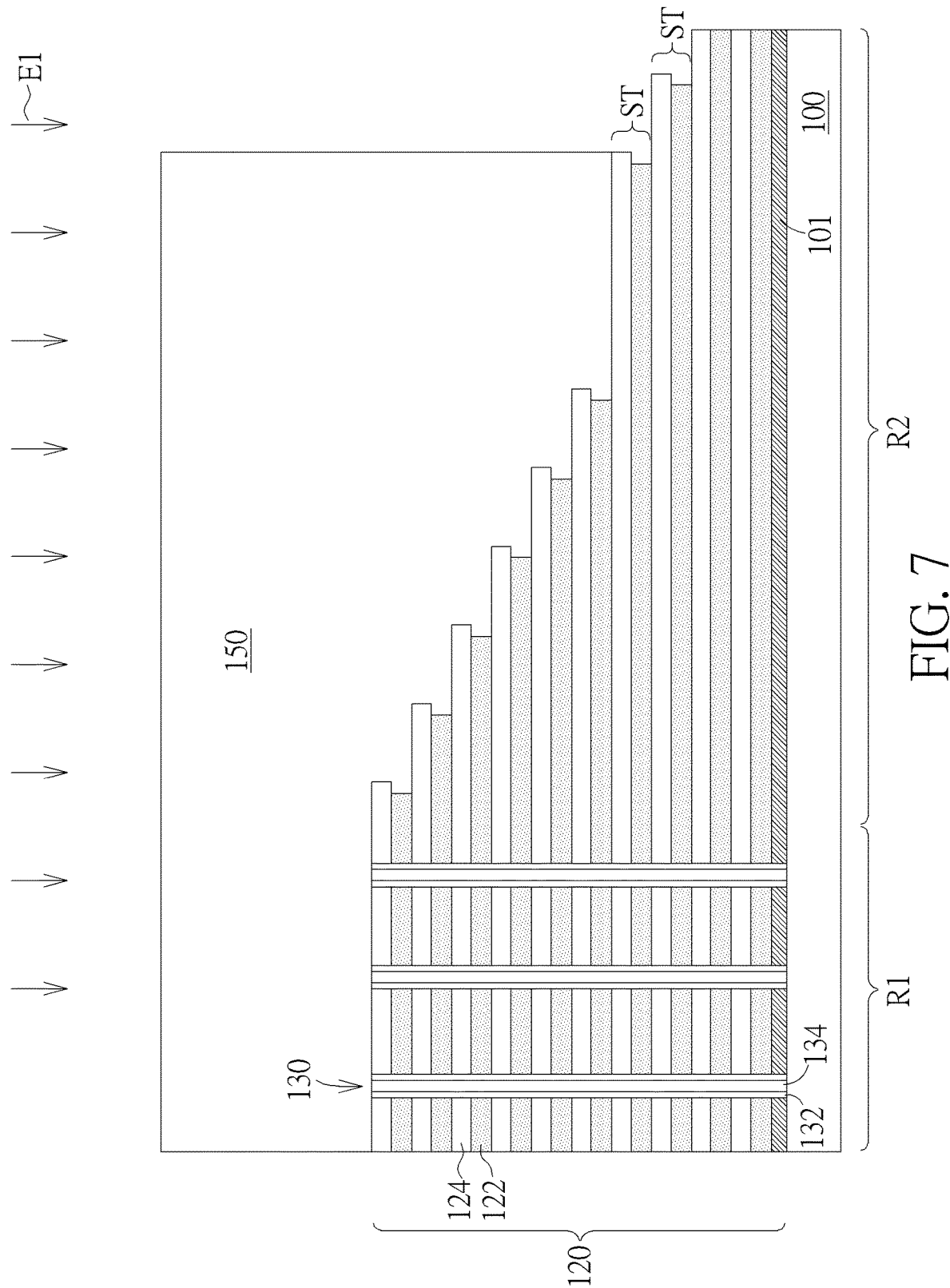
Figure 8:
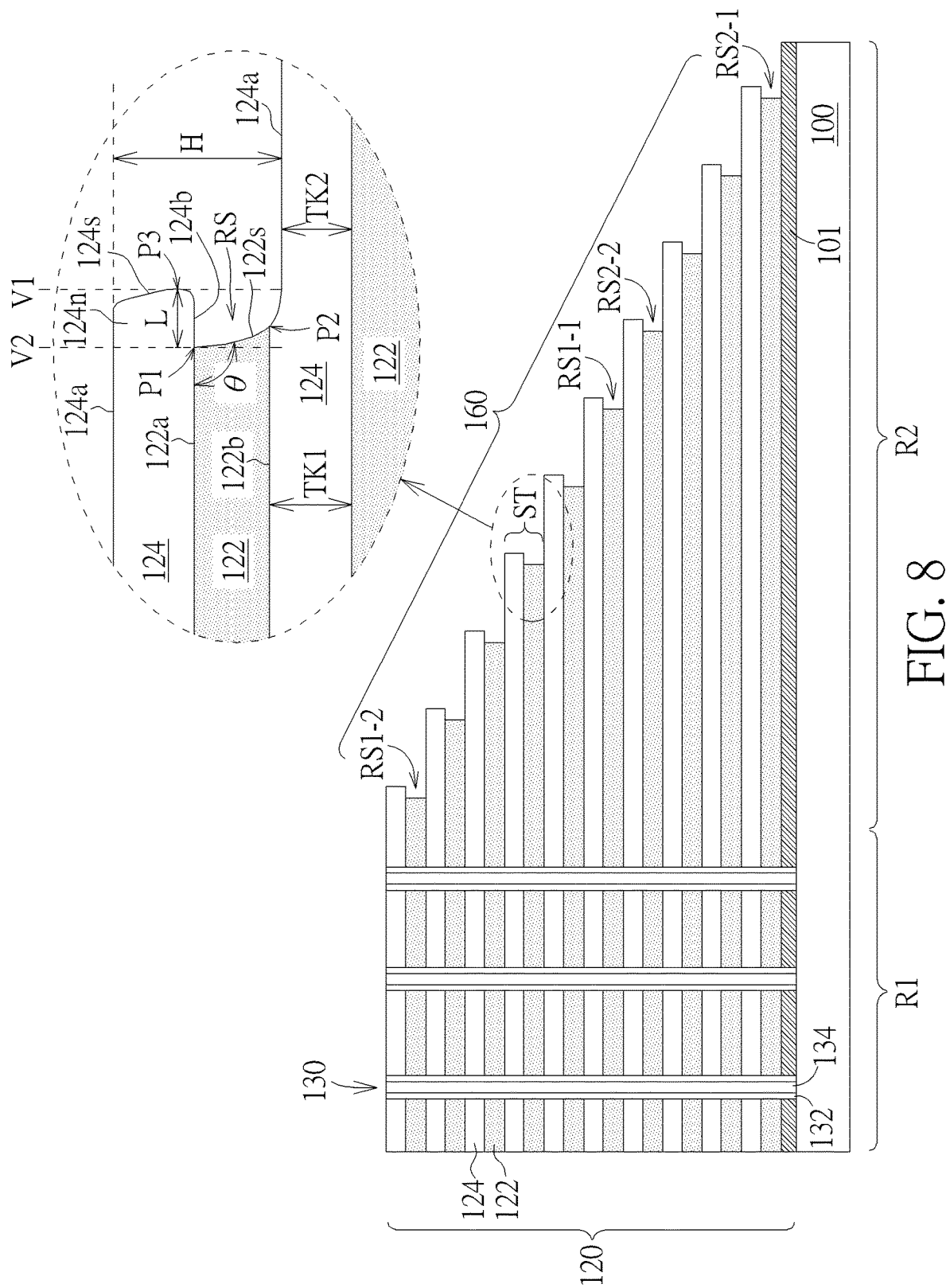

As shown in FIG. 5, by repeating the process loop shown in FIG. 2, FIG. 3 and FIG. 4, a plurality of steps ST may be formed on the upper half portion of the memory stack structure 120. Following, the patterned mask layer 140 is completely removed, and another patterned mask layer 150 (such as a photoresist layer) may be formed on the memory stack structure 120. The patterned mask layer 150 is used as an etching mask for the etching step E1 (such as a dry etching process and/or a wet etching process) to etch and remove the exposed portion of the memory stack structure 120 (the first exposed pair of the dielectric layer 124 and the conductive layer 122), thereby forming a step ST on the lower half portion of the memory stack structure 120. Subsequently, as shown in FIG. 6, a portion of the patterned mask layer 150 is trimmed off by the trim step E2 (such as a wet etching process) to expose a portion with a pre-determined width W of the top surface of the dielectric layer 124 of the step ST from the patterned mask layer 150. Following, as shown in FIG. 7, the etching step E1 is performed, using the trimmed patterned mask layer 150 as an etching mask to etch and remove the exposed portion of the memory stack structure 120 (the first exposed pair of the dielectric layer 124 and the conductive layer 122), thereby forming another step ST on the lower half portion of the memory stack structure 120. As shown in FIG. 8, the process loop shown in FIG. 5, FIG. 6 and FIG. 7 is repeated to form a plurality of steps ST on the lower half portion of the memory stack structure 120, thereby obtaining a complete staircase structure 160 of the memory stack structure 120. After forming the staircase structure 160, the patterned mask layer 150 is removed. The staircase structure 160 includes a plurality of steps ST that respectively include a conductive layer 122 and a dielectric layer 124 on the conductive layer 122. The staircase structure 160 may also be referred as a word line fan out structure of the three-dimensional (3D) memory device.

Please refer to the upper-right portion of FIG. 8, which is a schematic enlarged view of one of the steps ST of staircase structure 160. The height H of the step ST is approximately the height from the top surface 124a of the dielectric layer 124 of the step ST to the top surface 124a of the dielectric layer 124 of the next lower step ST. In the present invention, by adjusting the etching step E1, the sidewall 122s of the conductive layer 122 of the step ST may be recessed from the sidewall 124s of the dielectric layer 124 to form a recess RS that exposes a portion of the bottom surface 124b of the dielectric layer 124. The portion of the dielectric layer 124 protruding from the sidewall 122s of the conductive layer 122 along the horizontal direction (the direction parallel to the surface of the substrate 100) becomes a step nosing portion 124n of the step ST.

Please continue to refer to the upper-right portion of FIG. 8. The recess RS may include a top corner P1 and a bottom corner P2 which respectively are the joining points of the upper and lower ends of the sidewall 122s of the conductive layer 122 and the two dielectric layers 124 above and below the conductive layer 122. The step nosing portion 124n may include a length L which may approximately equal to the horizontal distance between the vertical line V1 through the most protruding point P3 of the sidewall 124s and the vertical line V2 through the top corner P1 of the recess RS. According to a preferred embodiment of the present invention, the length L of the step nosing portion 124n is smaller than ¼ of the height H of the step ST. According to some embodiments of the present invention, the thickness of the conductive layer 122 may be approximately 50 nm, the thickness of the dielectric layer 124 (the thickness TK1 of the portion of the dielectric layer 124 covered by the conductive layer 122) may be approximately 30 nm, the height H of the step ST may be approximately 80 nm, and the length L of the step nosing portion 124n may be smaller than 20 nm and larger than 5 nm. According to some embodiments of the present invention, the length L of the step nosing portion 124n may be approximately 15 nm, but is not limited thereto.

The depth of the recess RS may be the horizontal distance from the top corner P1 or the bottom corner P2 of the recess RS or any point of the sidewall 122s of the conductive layers 122 to the vertical line V1. By adjusting the etching step E1, the depth of the recess RS from the top corner P1 to the vertical line V1 may be different from the depth of the recess RS from the bottom corner P2 to the vertical line V1. According to some embodiments of the present invention, as shown in FIG. 8, the depth of the recess RS from the top corner P1 to the vertical line V1 (the depth of the upper portion of the recess RS) may be larger than the depth of the recess RS from the bottom corner P2 to the vertical line V1 (the depth of the lower portion of the recess RS). The sidewall 122s of the conductive layer 122 may gradually incline (from bottom to top) toward the side of the conductive layer 122, so that the angle θ between the sidewall 122s and the top surface 122a of the conductive layer 122 may be larger than 90 degrees. According to some embodiments of the present invention, by adjusting the etching step E1, the sidewall 122s of the conductive layer 122 may include a curved profile.

According to some embodiments of the present invention, in order to ensure that there is no residual conductive layer 122 on the dielectric layer 124 of the step ST (the dielectric layer 124 of the next lower step ST), over-etching is usually performed during the etching step E1 to etch the conductive layer 122. A portion of the dielectric layer 124 of the next lower step ST may be removed, so that the top surface 124a of the dielectric layer 124 of the lower step ST may have a concave profile. As a result, the thickness TK2 of the portion of the dielectric layer 124 not covered by the conductive layer 122 may be smaller than the thickness TK1 of the dielectric layer 124 covered by the conductive layer 122. The bottom surface 122b of the conductive layer 122 is higher than the top surface 124a of the dielectric layer 124. According to some embodiments of the present invention, the curved profile of the sidewall 122s of the conductive layer 122 and the concave profile of the top surface 124a of the dielectric layer 124 may be continuously connected. It should be understood that all of the steps ST of the staircase structure 160 may have the features of the length L, the height H, the angle θ, the thickness TK1, and the thickness TK2 as defined above.

According to some embodiments of the present invention, by adjusting the etching step E1, the plurality of recesses RS of the staircase structure 160 may have different depths (the depths defined by the top corners P1 are used to compare) according to the distances from the recesses RS to the substrate 100. For example, the staircase structure 160 shown in FIG. 8 is formed by performing a trim-etch process using two patterned mask layers, wherein the recess RS1-1 and the recess RS1-2 are formed by using the patterned mask layer 140 (see FIG. 2 to FIG. 4), and the recess RS 2-1 and the recess RS 2-2 are formed by using the patterned mask layer 150 (see FIG. 5 to FIG. 7). During the trim-etching process using the patterned mask layer 140, the etching step E1 may be adjusted to make the recesses closer to the substrate 100 have smaller depths, that is, the depth of the recess RS1-1 may be smaller than the depth of the recess RS1-2. Similarly, during the trim-etching process using the patterned mask layer 150, the etching step E1 may be adjusted to make the recesses closer to the substrate 100 have smaller depths, that is, the depth of the recess RS2-1 may be smaller than the depth of the recess RS2-2. In other embodiments when the recesses RS2-1, RS2-2, RS1-1 and RS1-2 are formed by a trim-etch process using one patterned mask layer, the recess RS2-1 that is closest to the substrate 100 may have the smallest depth among the recesses RS2-1, RS2-2, RS1-1 and RS1-2, and the recess RS1-2 that is farthest from the substrate 100 may have the largest depth among the recesses RS2-1, RS2-2, RS1-1 and RS1-2.

Figure 9:
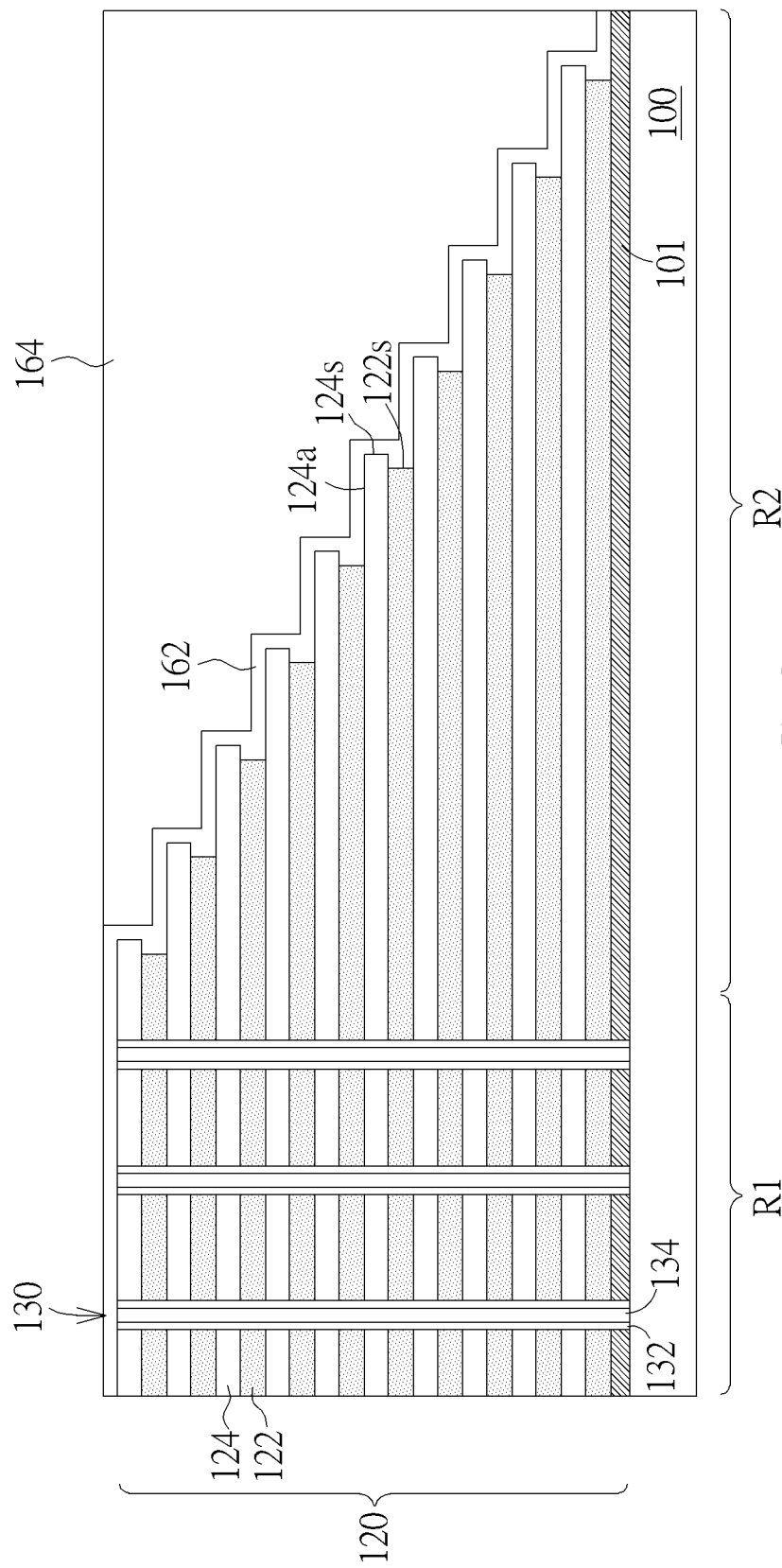

Please refer to FIG. 9. Subsequently, a thin film deposition process may be performed to form an insulating layer 162 conformally covering the top surface of the memory stack structure 120 and the staircase structure 160. The insulating layer 162 is in directly contact with the sidewalls 122s of the conductive layers 122 and the sidewalls 124s and top surfaces 124a of the dielectric layers 124 of the steps ST of the staircase structure 160. According to a preferred embodiment of the present invention, a thickness of the insulating layer 162 is larger than the depths of the recesses RS of the steps to completely fill each of the recesses RS. After forming the insulating layer 162, an interlayer dielectric layer 164 is formed on the substrate 100 in a blanket manner and completely covers the memory stack structure 120. A planarization process (such as a chemical mechanical polishing process) may be performed to remove unnecessary portion of the interlayer dielectric layer 164 until the insulating layer 162 on the top surface of the memory stack structure 120 is exposed and approximately coplanar with a flat surface of the interlayer dielectric layer 164, allowing subsequent manufacturing processes to be performed to form the interconnecting structures on the memory stack structure 120 and the interlayer dielectric layer 164. The insulating layer 162 and the interlayer dielectric layer 164 may respective include a dielectric material, such as silicon oxide ($SiO_x$), silicon nitride (SiN), silicon oxynitride (SiON), or a combination thereof, but is not limited thereto. According to an embodiment of the present invention, the insulating layer 162 and the interlayer dielectric layer 164 may different dielectric materials. For example, the insulating layer 162 may include silicon nitride, and the interlayer dielectric layer 164 may include silicon oxide. The insulating layer 162 may be used as a polishing stop layer during the chemical mechanical polishing process to remove the interlayer dielectric layer 164.

Figure 10:
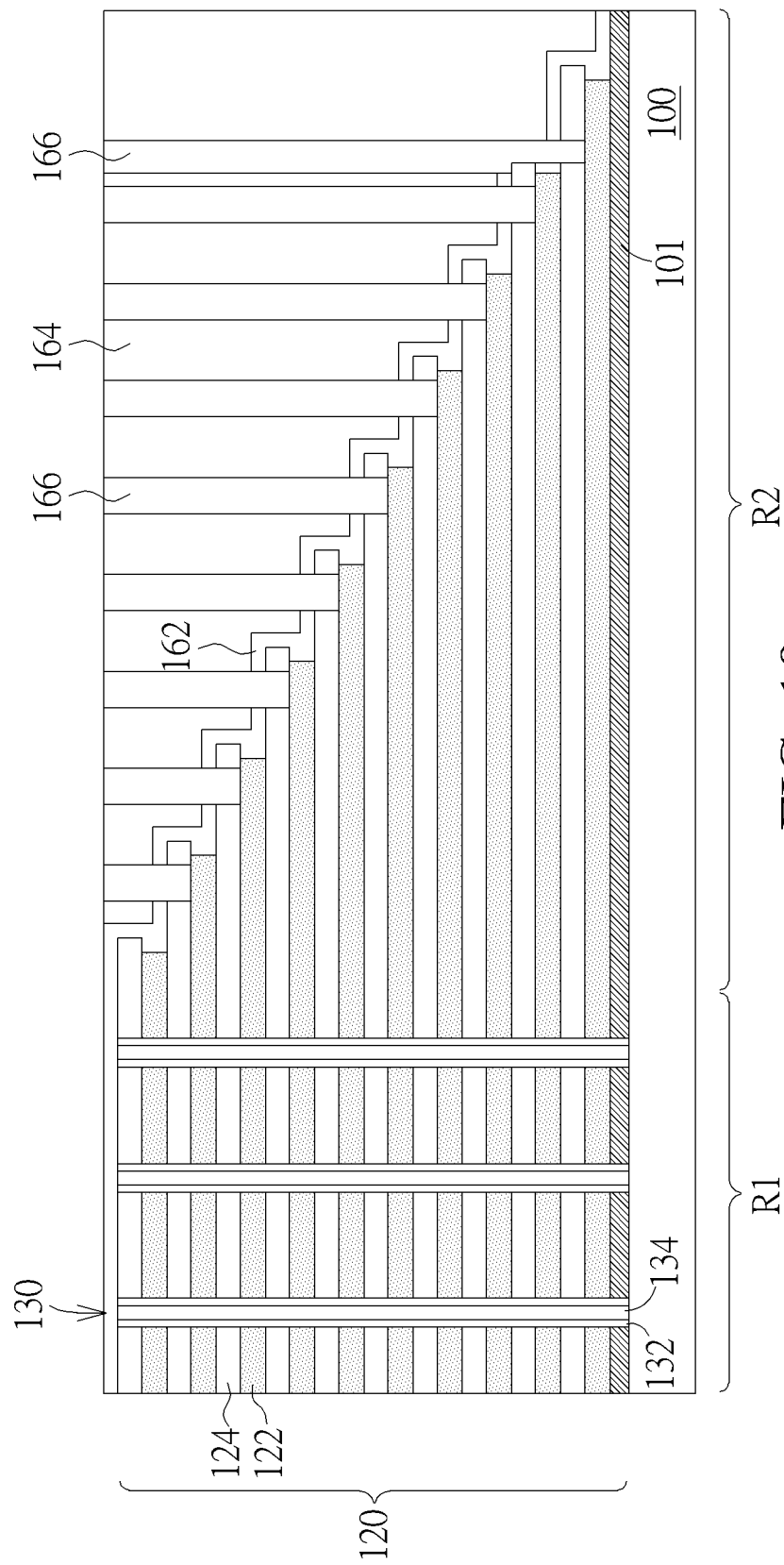

Please refer to FIG. 10. Subsequently, semiconductor manufacturing processes including patterning process (such as photolithography-etching process), etching process, film deposition process, and/or planarization process may be performed to form a plurality of word line contact plugs 166 on the second region R2 of the substrate 100 and respectively extending through the interlayer dielectric layer 164, the insulating layer 162 and the dielectric layers 124 to directly contact and electrically connect to the conductive layers 122 of the steps ST of the staircase structure 160. The word line contact plugs 166 may include a conductive material such as aluminum (Al), titanium (Ti), tantalum (Ta), tungsten (W), niobium (Nb), molybdenum (Mo), copper (Cu), titanium nitride (TiN), titanium carbide (TiC), tantalum nitride (TaN), titanium tungsten (Ti/W), titanium and titanium nitride (Ti/TiN), polysilicon, doped silicon, silicide, other metal or non-metal conductive materials, or any combination thereof, but is not limited thereto. According to an embodiment of the present invention, the word line contact plugs 166 may include tungsten (W).

In summary, the staircase structure of the three-dimensional (3D) memory device provided by the present invention is formed by performing the trim-etching process on the memory stack structure 120 that includes alternating layers of conductive layers 122 and dielectric layers 124, so that the steps ST of the staircase structure 160 may respectively have a step nosing portion 124n (the protruding edge portion of the dielectric layer 124 of each step ST). If the word line contact plugs 166 are misaligned (for example, a misaligned word line contact plug 166 is shown on the right of FIG. 10), the step nosing portion 124n may provide additional etch stop function to reduce the risk of the misaligned word line contact plug 166 directly contacting the conductive layer 122 of the next upper step ST. Therefore, device failure due to short circuit may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional memory device, comprising:
   a substrate comprising a first region and a second region;
   a memory stack structure comprising a plurality of conductive layers and dielectric layers alternately stacked on the substrate and extending from the first region to the second region, wherein the memory stack structure on the second region comprises a staircase structure comprising steps respectively comprising one of the conductive layers and one of the dielectric layers, wherein for each of the steps a sidewall of the conductive layer is recessed from a sidewall of the dielectric layer to form a recess that exposes a bottom surface of a step nosing portion of the dielectric layer;
   an interlayer dielectric layer disposed on the staircase structure; and
   a plurality of word line contact plugs respectively extending through the interlayer dielectric layer and one of the dielectric layers of the staircase structure to contact one of the conductive layers of the staircase structure, wherein at least one of the word line contact plugs has a first bottom surface directly contacting a top surface of one of the conductive layers and a second bottom surface directly contacting a top surface of one of the step nosing portions.

2. The three-dimensional memory device according to claim 1, wherein for each of the steps the sidewall of the conductive layer comprises a curved profile.

3. The three-dimensional memory device according to claim 1, wherein for each of the steps an angle between the sidewall and a top surface of the conductive layer is larger than 90 degrees.

4. The three-dimensional memory device according to claim 1, wherein portions of top surfaces of the dielectric layers of the staircase structure not covered by the conductive layers of the staircase structure comprise recessed profiles.

5. The three-dimensional memory device according to claim 1, wherein portions of the dielectric layers of the staircase structure not covered by the conductive layers comprise a thickness smaller than a thickness of portions of the dielectric layers covered by the conductive layers.

6. The three-dimensional memory device according to claim 1, further comprising an insulating layer disposed between the staircase structure and the interlayer dielectric layer, wherein the insulating layer direct contacts the sidewalls of the conductive layers and the sidewalls and top surfaces of the dielectric layers of the staircase structure.

7. The three-dimensional memory device according to claim 6, wherein a thickness of the insulating layer is larger than depths of the recesses of the staircase structure and completely fills the recesses of the staircase structure.

8. The three-dimensional memory device according to claim 1, wherein for the staircase structure the recess of the step that is closest to the substrate comprises a depth smaller than a depth of the recess of the step that is farthest from the substrate.

9. The three-dimensional memory device according to claim 1, further comprising a plurality of channel structures disposed in the memory stack structure on the first region of the substrate.

* * * * *